(12) United States Patent
Hayashi

(10) Patent No.: US 10,901,324 B2
(45) Date of Patent: Jan. 26, 2021

(54) IMPRINT METHOD, IMPRINT APPARATUS, AND ARTICLE MANUFACTURING METHOD USING THE SAME

(71) Applicant: CANON KABUSHIKI KAISHA, Tokyo (JP)

(72) Inventor: Nozomu Hayashi, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 791 days.

(21) Appl. No.: 14/376,221

(22) PCT Filed: Mar. 7, 2013

(86) PCT No.: PCT/JP2013/001435
§ 371 (c)(1),
(2) Date: Aug. 1, 2014

(87) PCT Pub. No.: WO2013/136730
PCT Pub. Date: Sep. 19, 2013

(65) Prior Publication Data
US 2015/0325526 A1 Nov. 12, 2015

(30) Foreign Application Priority Data

Mar. 12, 2012 (JP) ................................. 2012-053993
Mar. 4, 2013 (JP) ................................. 2013-041424

(51) Int. Cl.
*G03F 7/20* (2006.01)
*H01L 23/544* (2006.01)
(Continued)

(52) U.S. Cl.
CPC ........ *G03F 7/70608* (2013.01); *B29C 59/002* (2013.01); *B29C 59/026* (2013.01);
(Continued)

(58) Field of Classification Search
None
See application file for complete search history.

(56) References Cited

U.S. PATENT DOCUMENTS

2004/0233403 A1\* 11/2004 Gerhard ................ G01N 21/95
355/53
2006/0157444 A1 7/2006 Nakamura et al.
(Continued)

FOREIGN PATENT DOCUMENTS

| CN | 1800975 A | 7/2006 |
| EP | 2360524 A2 | 8/2011 |

(Continued)

OTHER PUBLICATIONS

Ikuo Yoneda ; Shinji Mikami ; Study of nanoimprint lithography for applications toward 22nm node CMOS devices. Proc. SPIE 6921, Emerging Lithographic Technologies XII, 692104 (Mar. 14, 2008); doi:10.1117/12.771149. Retrieved Online May 9, 2017 <http://proceedings.spiedigitallibrary.org/proceeding.aspx?articleid=830630>.\*

(Continued)

*Primary Examiner* — Joseph S Del Sole
*Assistant Examiner* — Manley L Cummins, IV
(74) *Attorney, Agent, or Firm* — Rossi, Kimms & McDowell LLP

(57) ABSTRACT

A imprint method includes contacting the pattern formed on the mold M with the imprint material R supplied to a shot on the substrate W; and detecting a plurality of alignment marks AMM and AMW in the contacting while changing a position of a detector for detecting the plurality of alignment marks AMM and AMW formed on the shot on the substrate W in accordance with a progress of filling of the imprint material R into the pattern formed on the mold M.

12 Claims, 6 Drawing Sheets

(51) Int. Cl.
| | |
|---|---|
| H01L 21/66 | (2006.01) |
| B29C 59/02 | (2006.01) |
| B29C 59/00 | (2006.01) |
| G03F 9/00 | (2006.01) |
| G03F 7/00 | (2006.01) |
| B82Y 10/00 | (2011.01) |
| B82Y 40/00 | (2011.01) |
| B29L 31/34 | (2006.01) |
| B29L 9/00 | (2006.01) |
| B29K 101/00 | (2006.01) |

(52) U.S. Cl.
CPC ............ *B82Y 10/00* (2013.01); *B82Y 40/00* (2013.01); *G03F 7/0002* (2013.01); *G03F 9/7088* (2013.01); *H01L 22/12* (2013.01); *H01L 23/544* (2013.01); *B29K 2101/00* (2013.01); *B29L 2009/00* (2013.01); *B29L 2031/34* (2013.01); *G03F 9/7046* (2013.01); *H01L 2924/0002* (2013.01)

(56) References Cited

U.S. PATENT DOCUMENTS

| | | | |
|---|---|---|---|
| 2007/0132157 A1 | 6/2007 | Tokita et al. | |
| 2009/0296090 A1* | 12/2009 | Saha | G01N 21/9501 356/369 |
| 2010/0031833 A1 | 2/2010 | Kasumi et al. | |
| 2010/0270705 A1 | 10/2010 | Okushima et al. | |
| 2011/0206852 A1* | 8/2011 | Shiode | B82Y 10/00 427/356 |
| 2014/0341462 A1* | 11/2014 | Sezginer | G06T 7/0008 382/149 |
| 2015/0014892 A1* | 1/2015 | Shinoda | G03F 7/0002 264/447 |

FOREIGN PATENT DOCUMENTS

| | | |
|---|---|---|
| JP | 2006-165371 A | 6/2006 |
| JP | 2007-165400 A | 6/2007 |
| JP | 2007-281072 A | 10/2007 |
| JP | 2008-244441 A | 10/2008 |
| JP | 2010214913 * | 3/2009 |
| JP | 2010-040879 A | 2/2010 |
| JP | 2010214913 * | 9/2010 |
| JP | 2010214913 A | 9/2010 |
| JP | 2011129720 A | 6/2011 |
| KR | 20110097641 A | 8/2011 |
| KR | 1020110097641 * | 8/2011 |

OTHER PUBLICATIONS

Ikuo Yoneda ; Yasutada Nakagawa ; A study of filling process for UV nanoimprint lithography using a fluid simulation. Proc. SPIE 7271, Alternative Lithographic Technologies, 72712A (Mar. 17, 2009); doi:10.1117/12 Retrieved Online May 9, 2017 <http://proceedings.spiedigitallibrary.org/proceeding.aspx?articleid=817285>.*

Journal of Vacuum Science & Technology B, Nanotechnology and Microelectronics: Materials, Processing, Measurement, and Phenomena 30, 06FB13 (2012); doi: 10.1116/1.4767122. Retrieved Online May 9, 2017 <http://avs.scitation.org/doi/pdf/10.1116/1.4767122>.*

Chinese Office Action issued in counterpart application No. CN201380013086.5, dated Jan. 5, 2016. English translation provided.

European Search Report issued in European counterpart application No. EP13760734.7, dated Jun. 25, 2015.

International Search Report for corresponding PCT/JP2013/001435, dated May 21, 2013.

Notification of Transmittal of the International Search Report and the Written Opinion of the International Searching Authority, or the Declaration for corresponding PCT/JP2013/001435, dated May 21, 2013.

Korean Office Action issued in counterpart application No. KR10-2014-7024456, dated Dec. 11, 2015. English translation provided.

* cited by examiner

[Fig. 1]
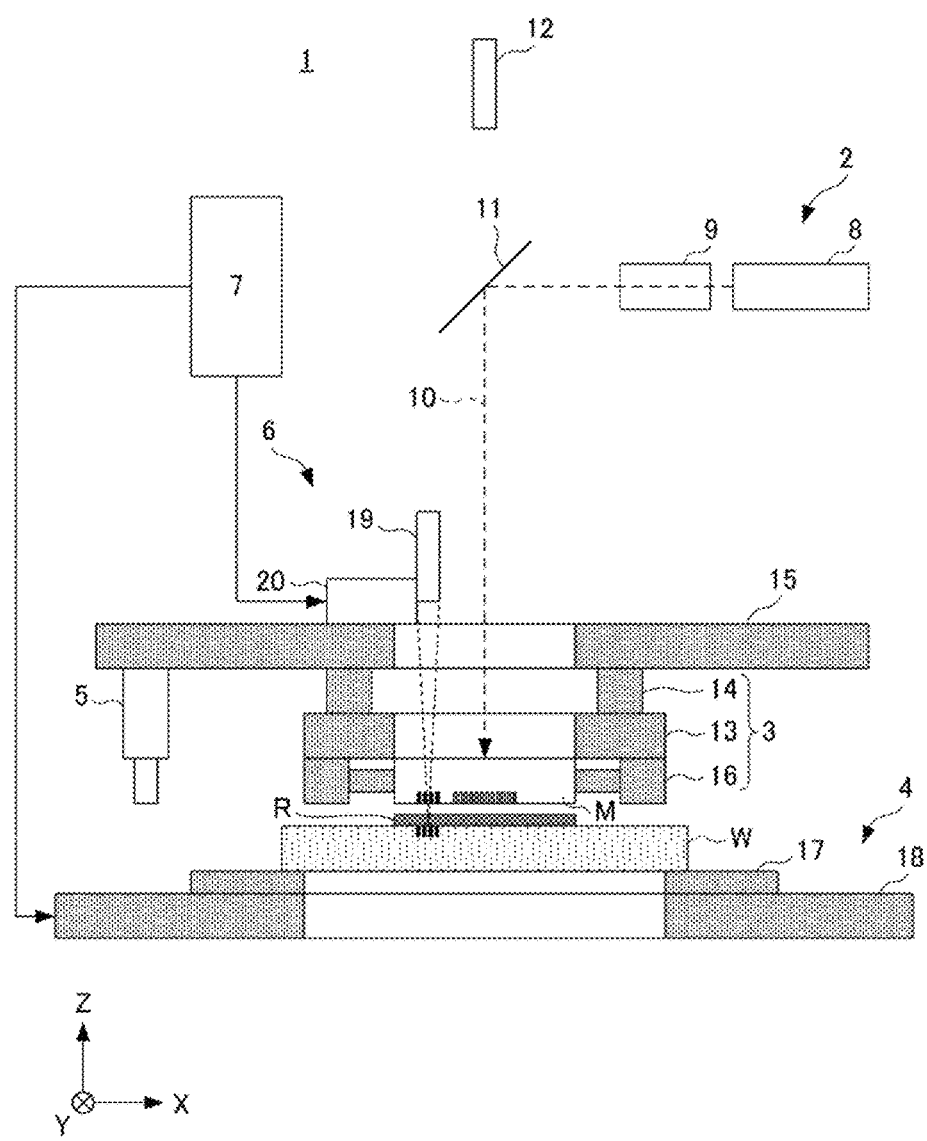

[Fig. 2A]
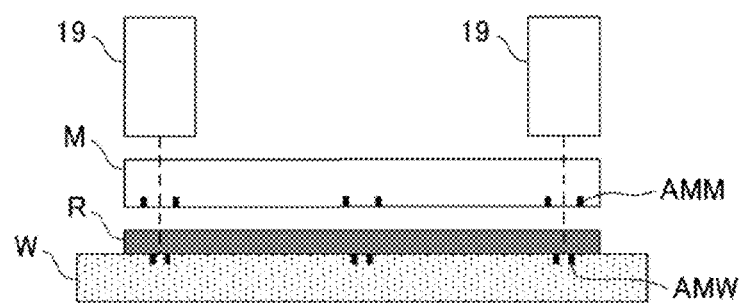
[Fig. 2B]
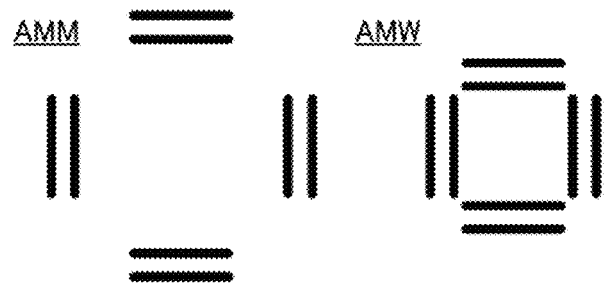
[Fig. 2C]
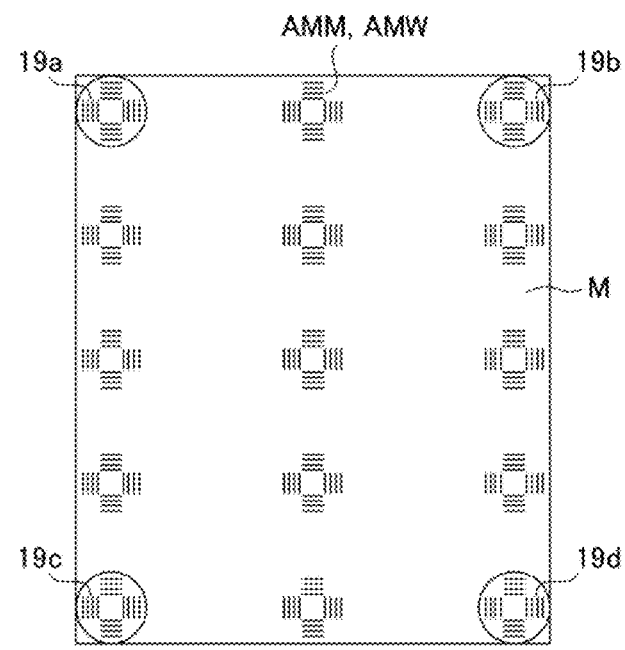

[Fig. 3]
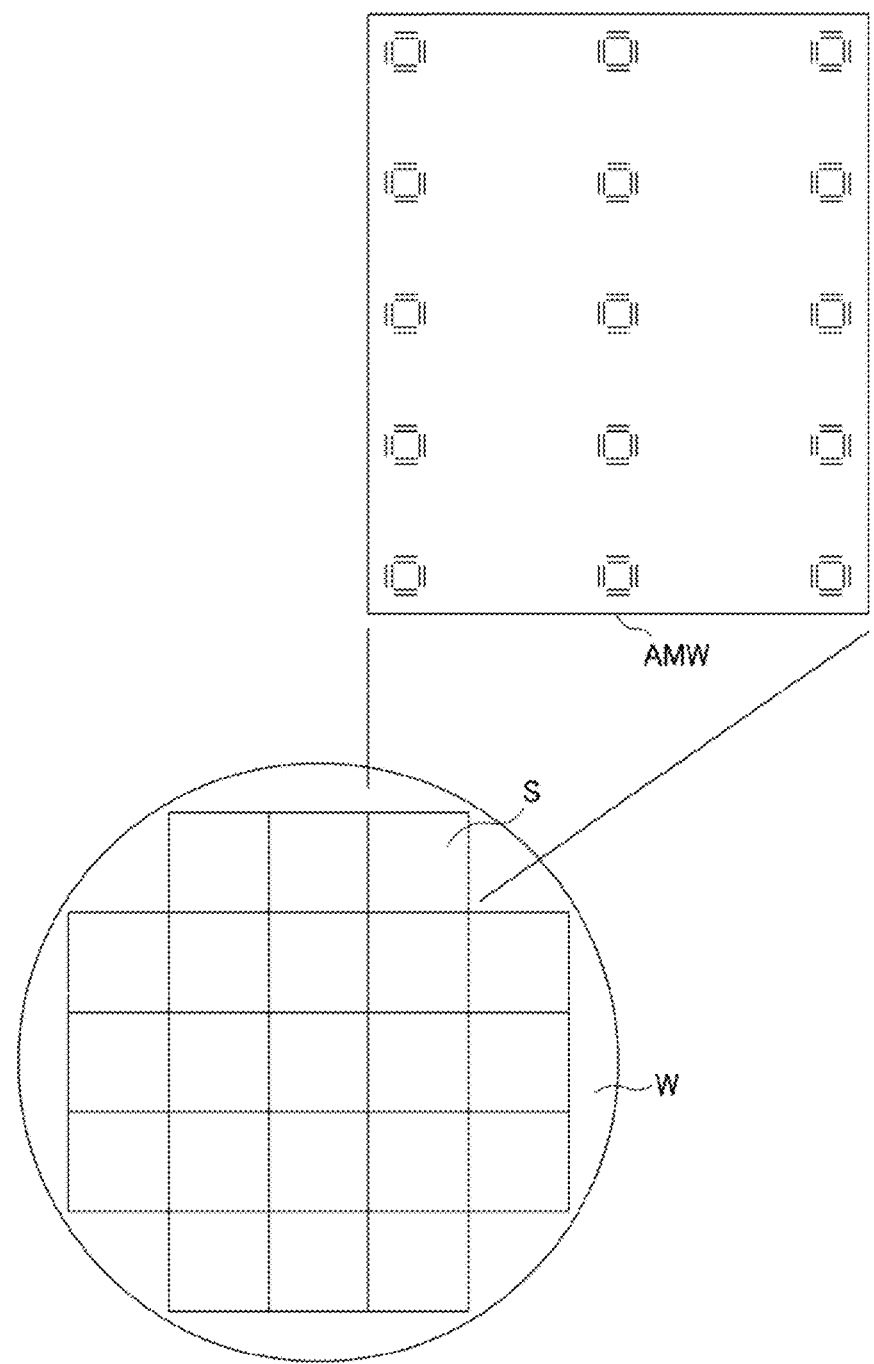

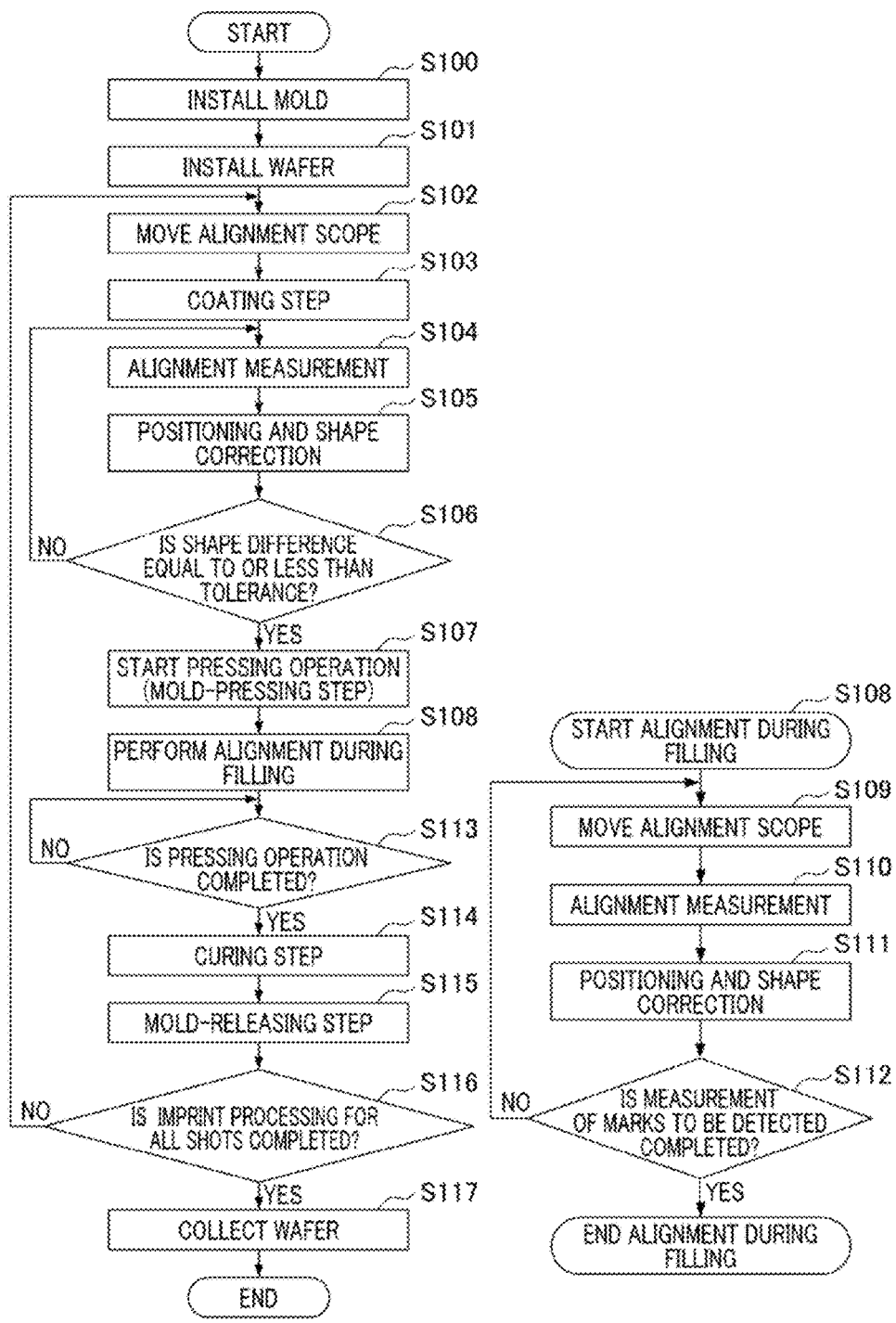
[Fig. 4]

[Fig. 5A]
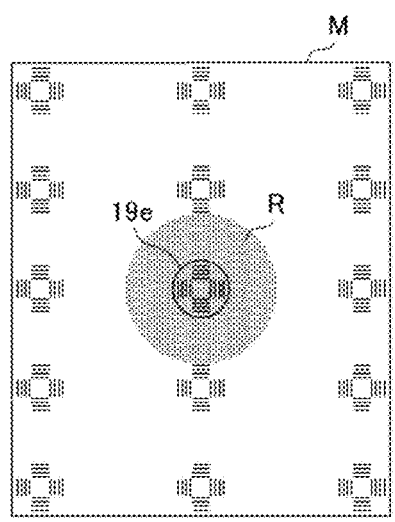
[Fig. 5B]
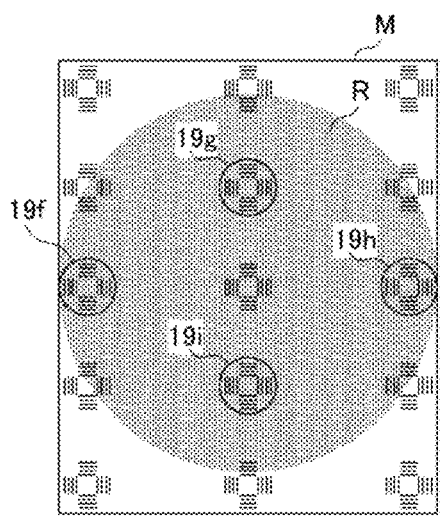

[Fig. 5C]
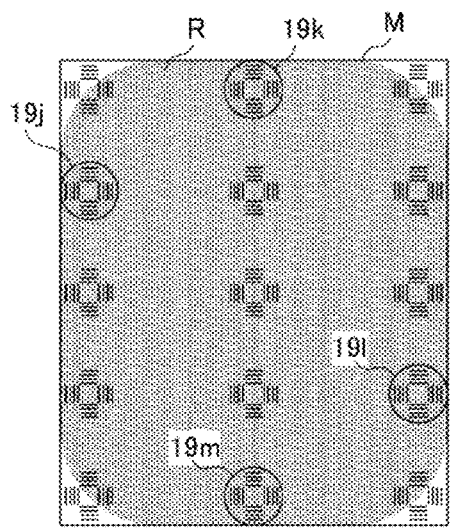
[Fig. 5D]
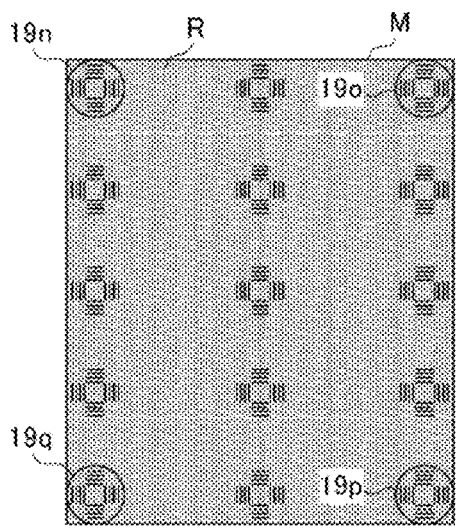

IMPRINT METHOD, IMPRINT APPARATUS, AND ARTICLE MANUFACTURING METHOD USING THE SAME

TECHNICAL FIELD

The present invention relates to an imprint method and an imprint apparatus, and an article manufacturing method using the same.

BACKGROUND ART

As the demand for microfabrication of semiconductor devices or MEMS increases, not only a conventional photolithography technology but also a microfabrication technology in which a resin (imprint material) on a substrate (wafer) is molded by a mold to thereby form a resin pattern on the substrate have been receiving attention. This technology is also referred to as an 'imprint technology', by which a fine structure with dimensions of a few nanometers can be formed on a substrate. One example of imprint technologies includes a photo-curing method. An imprint apparatus employing the photo-curing method first applies an ultraviolet curable resin (imprint material) to a shot region (imprint region) on a substrate. Next, the imprint material is molded by a mold. After the ultraviolet curable resin is irradiated with ultraviolet light for curing, the cured resin is released from the mold, whereby a resin pattern is formed on a substrate.

Here, when a resin applied to a shot is molded by a mold, the position of the shot and the position of the mold need to be superposed to each other with high accuracy. Patent Literature 1 discloses an imprint method in which an alignment mark framed on a mold and an alignment mark formed on a substrate are detected by different detecting units to thereby perform positioning based on the relative position information therebetween.

CITATION LIST

Patent Literature

[Patent Literature 1] Japanese Patent Laid-Open No. 2007-281072

Here, the shape of the shot (more specifically, the shape of a substrate-side pattern, which is formed in advance in a step preceding that the shot is conveyed to an imprint apparatus, on the shot) may be deformed, and thus, it is preferable that an offset between the deformed and undeformed shape is corrected prior to molding of a mold. In other words, even in the imprint apparatus disclosed in Patent Literature 1 in order to appropriately correct a deformation component, in particular, a high-degree component of the shot, it is need to perform alignment measurement at a plurality of positions (alignment marks) on a shot using a plurality of detecting units and then statistical processing. However, in the imprint apparatus disclosed in Patent Literature 1, it is difficult to arrange the number of detecting unit (e.g., alignment scopes) required for correcting a shot component due to limitations such as space constraints. Thus, a shot deformation component which can be corrected is only a linear component such as a shift component, a rotation component, a magnification component, or the like but it is difficult to correct a high-degree component typified by an arcuate component, a barrel component, a pincushion component, or the like.

SUMMARY OF INVENTION

The present invention provides an imprint method that is advantageous for improving superposition accuracy during imprint processing.

According to an aspect of the present invention, an imprint method for transferring a pattern to an imprint material by contacting the imprint material on a substrate with the pattern formed on a mold is provided that includes contacting the pattern formed on the mold with the imprint material R supplied to a shot on the substrate; and detecting a plurality of alignment marks in the contacting while changing a position of a detector for detecting the plurality of alignment marks formed on the shot on the substrate in accordance with a progress of filling of the imprint material R into the pattern formed on the mold.

According to the present invention, an imprint method that is advantageous for improving superposition accuracy during imprint processing may be provided.

Further features of the present invention will become apparent from the following description of exemplary embodiments with reference to the attached drawings.

BRIEF DESCRIPTION OF DRAWINGS

FIG. 1 is a diagram illustrating the configuration of an imprint apparatus according to one embodiment of the present invention.

FIG. 2A is a diagram illustrating the arrangement of alignment scopes.

FIG. 2B is a diagram illustrating the arrangement of alignment scopes.

FIG. 2C is a diagram illustrating the arrangement of alignment scopes.

FIG. 3 is a diagram illustrating alignment of a peripheral shot on a wafer.

FIG. 4 is a flowchart illustrating the sequence of operations during imprint processing.

FIG. 5A is a diagram illustrating the arrangement a shot on a wafer.

FIG. 5B is a diagram illustrating the arrangement of a shot on a wafer.

FIG. 5C is a diagram illustrating the arrangement of a shot on a wafer.

FIG. 5D is a diagram illustrating the e arrangement of a shot on a wafer.

DESCRIPTION OF EMBODIMENTS

Hereinafter, preferred embodiments of the present invention will be described with reference to the drawings.

Firstly, a description will be given of the configuration of an imprint apparatus according to one embodiment of the present invention. FIG. 1 is a schematic diagram illustrating the configuration of an imprint apparatus 1 of the present embodiment. The imprint apparatus 1 is an apparatus that is used in the manufacture of devices such as semiconductor devices and the like as articles, and forms a pattern on resin (imprint material) on a wafer (on a substrate) that is a substrate to be treated, using a mold. Here, the imprint apparatus of the present embodiment is an imprint apparatus employing a photo-curing method for curing a resin by the irradiation of ultraviolet light. The imprint apparatus 1 sequentially forms a pattern on a plurality of shots (pattern-forming regions) present on a wafer by repeating an imprint cycle. Here, the imprint cycle refers to a cycle for forming a pattern on one shot on a wafer by curing a resin while a mold is being pressed against (contacted with) the resin on the wafer. In the following drawings, a description will be given where the Z axis is aligned parallel to the optical axis of an irradiation system that irradiates a resin on a wafer with ultraviolet light, and mutually orthogonal axes X and Y are aligned in a plane perpendicular to the Z axis. The imprint apparatus 1 includes a light irradiation unit 2, a mold holding mechanism 3, a wafer stage 4, a dispenser 5, an alignment detection system 6, and a control unit 7.

The light irradiation unit 2 irradiates a resin R with the ultraviolet light 10 via a mold M to thereby cure the resin R. The resin R in the present embodiment is an ultraviolet curable resin. The light irradiation unit 2 includes a light source unit 8 and an optical system 9. The light source unit 8 includes a light source (not shown) such as a halogen lamp for emitting the ultraviolet light 10 (e.g., i-rays, g-rays) and an elliptical mirror (not shown) for collecting light emitted from the light source. The optical system 9 includes a lens or an aperture used for irradiating the resin R on a shot with the ultraviolet light 10, and a half mirror 11. The aperture is used for field angle control and outer peripheral light-shielding control. With the aid of the field angle control, only a target shot can be irradiated with the ultraviolet light 10. With the aid of the outer peripheral light-shielding control, the ultraviolet light 10 can be limited under illumination so as not to exceed the external shape of a wafer W. The optical system 9 may also include an optical integrator for uniformly illuminating the mold M. The ultraviolet light 10 of which the range has been defined by the aperture is incident on the resin R on the wafer W via the mold M. Furthermore, in the present embodiment, the imprint apparatus 1 includes an observation scope 12 that observes the entire shot via the half mirror 11. The observation scope 12 is used for confirming the state of imprint processing (a pressing operation and progress state of filling).

The outer peripheral shape of the mold M is a polygon (preferably, rectangular or square) and the mold M includes a pattern section on which, for example, the concave and convex pattern of a circuit pattern or the like to be transferred is three-dimensionally formed, on the surface facing the wafer W. In order to pass through the ultraviolet light 10 for curing the resin R, the mold M is formed of any material which is transparent to wavelengths of the ultraviolet light 10, for example, quartz.

The mold holding mechanism 3 includes a mold chuck 13 that holds the mold M and a mold drive mechanism 14 that moves the mold chuck 13 (the mold M). The mold drive mechanism 14 is supported on a bridge surface plate 15. The mold drive mechanism 14 includes a positioning mechanism that controls the position of the mold M in the directions of six axes and a mechanism that presses the mold M against the resin R on the wafer W and releases the mold M from the cured resin R. Here, the six axes refer to the X axis, the Y axis, the Z axis, and the rotation direction of each axis in the XYZ coordinate system where the support plane of the mold chuck 13 (plane for supporting the wafer W) is aligned to the XY-plane and the direction orthogonal to the XY-plane is aligned to the Z axis. Furthermore, the mold holding mechanism 3 includes a magnification correction mechanism (shape correction mechanism) 16 that is installed on the mold chuck 13. The magnification correction mechanism 16 corrects the shape of the mold M by applying pressure to the mold M from the outer peripheral direction using, for example, a cylinder that operates with a fluid such as air or oil. Or, the magnification correction mechanism 16 corrects the shape of the mold M by controlling the temperature of the mold M using a temperature control unit that controls the temperature of the mold M. The wafer W is deformed (in general, expanded or contracted) by carrying out the process such as heat treatment. Accordingly, the magnification correction mechanism 16 corrects the shape of the mold M depending on the deformation of the wafer W described above such that an overlay error falls within an allowable range.

The wafer W is, for example, a single crystal silicon substrate, an SOI (Silicon on Insulator) substrate, or a glass substrate. The pattern (pattern-including layer) of the resin R is formed on a plurality of shots on the wafer W by a pattern section. The pattern (hereinafter referred to as a "substrate-side pattern") has already been formed on the plurality of shots in the previous step before the wafer W is conveyed into the imprint apparatus 1.

The wafer stage (substrate holding unit) 4 includes a wafer chuck 17 that holds the wafer W by sucking it by vacuum suction or the like, and a stage drive mechanism 18 that moves the wafer chuck 17 (the wafer W). As in the mold drive mechanism 14, the stage drive mechanism 18 includes a positioning mechanism that controls the position of the wafer W by controlling the position of the wafer chuck 17 in the directions of six axes.

The dispenser 5 applies the resin R (imprint material) to a shot on the wafer W. The dispenser 5 includes a tank that contains therein the resin R, a nozzle that discharges the resin R supplied from the tank via a supply passage, a valve provided on the supply passage, and a supply amount control unit, all of which are not shown. The supply amount control unit controls the valve such that the resin R is applied to one shot to thereby adjust the supply amount of the resin R to the wafer W.

The alignment detection system 6 includes a plurality of (in this case, four) alignment scopes (detectors) 19 and an alignment stage mechanism 20. The alignment scope 19 detects an alignment mark AMM formed on the mold M and an alignment mark AMW formed on the wafer W via the mold M so as to perform positioning between the mold M and the wafer W. The alignment stage mechanism 20 is mounted on the bridge surface plate 15 and can move a plurality of the alignment scopes 19 independently so as to change the detection position to be detected by each alignment scope 19.

FIGS. 2A to 2C are diagrams illustrating the arrangement of the alignment scope 19, and a mold M-side alignment mark AMM formed on the mold M and a wafer W-side alignment mark AMW formed on the wafer W. In particular, FIG. 2A is a schematic cross-sectional view illustrating the arrangement of the alignment scopes 19, the mold M, the resin R, and the wafer W. FIG. 2B is an enlarged view illustrating the alignment marks AMM and AMW as viewed from the ultraviolet light incident side. The alignment mark AMM and the alignment mark AMW are arranged so as not to overlap with each other as viewed from the ultraviolet light incident side to the mold M side in the state shown in FIG. 2A. Furthermore, FIG. 2C is a schematic plan view illustrating the arrangement of a plurality of alignment marks AMM and AMW as viewed from the ultraviolet light incident side to the mold M side. In particular, the regions 19a to 19d at the four corners of the mold M are regions that are positions (detection positions) to be (specifically) detected by the alignment scopes 19. On the other hand, FIG. 3 is a plan view illustrating the arrangement of shots on the wafer W. The wafer W includes a plurality of shots S on the surface thereof, and a plurality of alignment marks AMW is formed in each shot S.

The control unit 7 may control the operation, adjustment, and the like of the components of the imprint apparatus 1. The control unit 7 is constituted by a computer or the like and is connected to the components of the imprint apparatus 1 through a line so as to execute control of the components by a program or the like. The control unit 7 of the present embodiment controls at least the operation of the alignment detection system 6 and the wafer stage 4. Note that the control unit 7 may be integrated with the rest of the imprint apparatus 1 (provided in a shared housing) or may be provided separately from the rest of the imprint apparatus 1 (provided in a separate housing).

Furthermore, the imprint apparatus 1 includes a surface plate (not shown) for forming reference plane on which the wafer stage 4 is placed, a bridge surface plate 15 that fixes the mold holding mechanism 3, and a column that extends from the surface plate and supports the bridge surface plate 15 via a vibration isolator that isolates vibration from a floor. Furthermore, the imprint apparatus 1 includes a mold conveyance mechanism that conveys into/out the mold M between the exterior of the apparatus and the mold holding mechanism 3, and a substrate conveyance mechanism that conveys into/out the wafer W between the exterior of the apparatus and the wafer stage 4, and the like, all of which are not shown.

Next a description will be given of an imprint method performed by the imprint apparatus 1. FIG. 4 is a flowchart illustrating the sequence of operations of a series of imprint processing performed by the imprint apparatus 1. Firstly, the control unit 7 causes the mold conveyance mechanism to convey the mold M to the mold chuck 13 and causes the mold chuck 13 to hold the mold M after positioning (step S100). Here, after installation of the mold M, the control unit 7 causes the alignment stage mechanism 20 to move the alignment scope 19. In particular, in the present embodiment, the control unit 7 operates the alignment scope 19 such that the detection position of the alignment scope 19 is positioned at the alignment marks AMW which are present at the four corners (the regions 19a to 19d) of the shot as shown in FIG. 2C.

Next, the control unit 7 causes the substrate conveyance mechanism to convey the wafer W to the wafer chuck 17 and then causes the wafer chuck 17 to hold the wafer W (step S101). It should be noted that at least one layer pattern has already been formed together with the alignment marks AMW on the wafer W. The control unit 7 causes the alignment scope 19 to measure the relative position between the alignment marks AMW on the wafer W and the alignment marks AMM on the mold M by transmitting through the alignment marks AMM on the mold M.

Next, the control unit 7 causes the alignment stage mechanism 20 to start movement of the alignment scope 19 (step S102). Next, the control unit 7 drives the wafer stage 4 so as to make a shot to be processed this time to be positioned at the coating position of the dispenser 5 concurrently with the movement of the alignment scope 19 and causes the dispenser 5 to apply the resin R to the wafer W (step S103: coating step). Furthermore, the control unit 7 causes the stage drive mechanism 18 to drive the wafer stage 4 such that the shot is positioned at a position where the wafer W is pressed against the mold M.

Next, the control unit 7 performs the alignment measurement in a dye-by-dye alignment method (step S104). At this time, the control unit 7 causes the alignment scope 19 to capture images of the alignment marks AMM on the mold M and the alignment marks AMW on the wafer W and causes an image processing apparatus (not shown) to measure the relative position between the alignment marks AMM and AMW. Then, the control unit 7 measures the difference (coordinate component, rotation component, magnification component, trapezoidal component, and the like) of shot shapes between the mold M and the wafer W based on the results of detection at four positions corresponding to the regions 19a to 19d.

Next, the control unit 7 causes the magnification correction mechanism 16 to correct the shape of the mold M so as to match the shape of the pattern section formed on the mold M with the shape of the shot (the shape of the substrate-side pattern) on the wafer W as appropriate concurrently with positioning (step S105). Next, the control unit 7 performs shape difference tolerance determination because an error may occur due to driving error of the magnification correction mechanism 16 (step S106). Here, when the control unit 7 determines that the shape difference is greater than a tolerance (NO), the process returns to step S104, and the control unit 7 performs the alignment measurement again and causes the magnification correction mechanism 16 to correct the shape of the mold M until the shape difference is equal to or less than 8 predetermined tolerance. On the other hand, when the control unit 7 determines in step S106 that the shape difference is equal to or less than a tolerance (YES), the control unit 7 starts the pressing operation (step S107: mold-pressing step).

Next, in order to perform shape correction with high accuracy, the control unit 7 sequentially performs the alignment measurement during the pressing operation, that is, during the filling of the resin R in the mold M (step S108). FIGS. 5A to 5D are plan views illustrating the filled state of the resin R upon pressing and the detection position of alignment measurement in association with the filled state in a time-series manner. At this time, the detection position of alignment measurement may vary and the detection positions shown in FIGS. 5A to 5D are just an example. Firstly, the control unit 7 performs statistical processing for the measured values and calculates a correction value for the deformed part of a shot to thereby perform positioning as described below. As shown in FIGS. 5A to 5D, it can be seen that the contact region of the resin R to be filled radially outwardly extends from the center upon start of contact of the resin R with the mold M. At this time, the measuring condition is not constant due to the difference in color between a portion in which the filling of the resin R has been completed and a portion in which the filling of the resin R has not been completed, the difference in refractive index of the resin R therebetween, and the like. Consequently, measurement data on the alignment marks AMM and AMW on the boundary between a portion in which the filling of the resin R has been completed and a portion in which the filling of the resin R has not been completed cannot be used for correction. Thus, the control unit 7 causes the alignment scope 19 to move in accordance with the filling of the resin R (step S109) in order radially outward from a region 19e which lies near the center of a shot in which the filling of the resin R has been completed to thereby measure regions 19f to 19q (step S110). At this time, the control unit 7 employs the observation scope 12 for observing the entire shot in order to determine the position at which the filling of the resin R has been completed.

Firstly, in the state where the resin R is filled as shown in FIG. 5A, the alignment scope 19 performs the alignment measurement of the region 19e which lies in the center of shot in which the filling of the resin R has been completed. Next, in the state where the resin R is filled as shown in FIGS. 5B and 5C, the alignment scope 19 performs the alignment measurement of the regions 19f to 19m in sequence in association with the state where the filling of the resin R has been completed. In the state where the filling of the resin R has been filially completed as shown in FIG. 5D, the alignment scope 19 performs the alignment measurement of the regions 19n to 19q which lie the outermost of the shot. As described above, the imprint apparatus 1 performs the alignment measurement at a plurality of (four or greater) positions (in the present embodiment, the regions 19e to 19q) so that the imprint apparatus 1 can acquire the amount of correction with high accuracy. Also, the control unit 7 causes the observation scope 12 to measure a time, during which the resin R is spread over the first shot, in advance so that the positions of the alignment marks AMM and AMW to be measured at the next and subsequent shots can be determined. Thus, the operation for confirming the completion of the filling of the resin R by the observation scope 12 can be omitted. The correction during the filling of the resin R may be performed each time the alignment marks AMM and AMW are measured or may also be performed after completion of the measurement of all the alignment marks AMM and AMW. Then, the control unit 7 causes the magnification correction mechanism 16 to correct the shape of the mold M so as to match the shape of the pattern section formed on the mold M with the shape of the shot on the wafer W as appropriate (step S111).

Next, the control unit 7 determines whether or not the measurement of all the alignment marks AMM and AMW to be detected, which exist in the range filled with the resin R, has been completed (step S112). Here, when the control unit 7 determines that the measurement of all the alignment marks AMM and AMW to be detected has been completed (YES), the control unit 7 ends alignment measurement during the filling of the resin R, and the process shifts to step S114. On the other hand, when the control unit 7 determines that the measurement of all the alignment marks AMM and AMW to be detected has not been completed (NO), the process returns to step S109, and the control unit 7 repeatedly performs alignment measurement until the measurement of all the alignment marks AMM and AMW to be detected has been completed.

Next, the control unit 7 determines whether or not the pressing operation is completed (whether or not the filling of the resin R to the mold M is completed) (step S113). Here, while the filling of the resin R is incomplete, that is, when the control unit 7 determines that the filling of the resin R to the mold M is not completed (NO), the control unit 7 repeatedly performs determination until the filling of the resin R in the mold M is completed. On the other hand, when the control unit 7 determines that the filling of the resin R to the mold M is completed (YES), the control unit 7 causes the light irradiation unit 2 to irradiate the resin R on the wafer W with the ultraviolet light 10 via the mold M to thereby cure the resin R (step S114: curing step). After the resin R is cured, the control unit 7 causes the mold drive mechanism 14 to raise the mold M to thereby release the mold M from the cured resin R (step S115: mold-releasing step).

Next, the control unit 7 determines whether or not imprint processing (pattern-forming step) has been completed for all the shots on the wafer W (step S116). Here, when the control unit 7 determines that there is still a shot not subjected to imprint processing (NO), the process returns to step S102 and the control unit 7 repeats imprint processing for the next shot. On the other hand, when the control unit 7 determines that imprint processing has been completed for all the shots on the wafer W (YES), the control unit 7 causes the substrate conveyance mechanism to collect the wafer W from the wafer chuck 17 (step S117), and all the processing ends.

As described above, the control unit 7 causes the alignment scope 19 to drive in association with the filled state of the resin R to thereby perform alignment measurement at a plurality (four or greater) of detection positions during the pressing operation (during the filling of the resin R in the mold M). Here, the measuring condition is different between a portion in which the filling of the resin R has been completed and a portion in which the filling of the resin R has not been completed during the filling of the resin R to the pattern section (concave and convex pattern) of the mold M, and thus the measured value cannot be used for correction. In contrast, in the present embodiment, not only linear components but also high-degree components can be corrected by performing alignment measurement at many more positions, resulting in an improvement in superposition accuracy. Also, in the present embodiment, the control unit 7 performs alignment measurement from the position at which the filling of the resin R has been completed, i.e., from the center of the mold M toward the radially outward direction while confirming the fact that the filling of the resin R has been completed using the observation scope 12. Thus, the operation for confirming the completion of the filling of the resin R by the observation scope 12 can be omitted. Furthermore, the time required for alignment measurement and correction overlaps the pressing time (the filling time of the resin R), that is, is hidden within the pressing time, resulting in no increase in time required for the entire imprint processing. Thus, superposition accuracy can be improved without changing the time required for the entire imprint processing.

As described above, according to the present embodiment, an imprint method that is advantageous for improving superposition accuracy during imprint processing may be provided.

While, in the embodiment, the control unit 7 waits for the completion of the filling of the resin R after the measurement of all the alignment marks AMM and AMW to be detected has been completed and then cures the resin R, the control unit 7 may continue alignment measurement while waiting for the completion of the filling of the resin R to thereby continue positioning and shape correction. While, in the embodiment, the control unit 7 causes the alignment scope 19 to move in accordance with the progress of filling of the resin R, the alignment marks AMM and AMW only near the center of the shot may be measured for correction when the shape of the shot and the shape of the mold M are stable.

Furthermore, in the embodiment, when the control unit 7 measures the alignment marks AMM and AMW in order such that the distance of travel of the alignment scope 19 becomes the shortest during the measurement of the alignment marks AMM and AMW upon filling of the resin R, the time required for the entire imprint processing can further be shortened. Also, upon alignment measurement during the filling of the resin R, the time required for the travel of the alignment scope 19 is eliminated by using the observation scope 12 instead of the alignment scope 19, resulting in a further reduction in time.

(Article Manufacturing Method)

A method for manufacturing a device (semiconductor integrated circuit element, liquid display element, or the like) as an article may include a step of forming a pattern on a substrate (wafer, glass plate, film-like substrate, or the like) using the imprint apparatus described above. Furthermore, the manufacturing method may include a step of etching the substrate on which a pattern has been formed. When other article such as a patterned medium (storage medium), an optical element, or the like is manufactured, the manufacturing method may include other step of processing the substrate on which a pattern has been formed instead of the etching step. The article manufacturing method of the present embodiment has an advantage, as compared with a conventional article manufacturing method, in at least one of performance, quality, productivity and production cost of an article.

While the embodiments of the present invention have been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-053993 filed on Mar. 12, 2012, and Japanese Patent Application No. 2013-041424 filed on Mar. 4, 2013, which are hereby incorporated by reference herein in their entirety.

The invention claimed is:

1. An imprint method of forming a pattern of an imprint material by contacting the imprint material on a substrate with a mold having the pattern, the imprint method comprising the steps of:
contacting the mold with the imprint material on the substrate to spread a contact region of the mold with the imprint material;
sequentially detecting a plurality of alignment marks on the substrate while changing a position of a detector for detecting an alignment mark, among the plurality of alignment marks on the substrate, while spreading the contact region of the mold with the imprint material in the contacting step;
sequentially aligning the substrate with respect to the mold for each detected alignment mark; and
determining a completion of the spreading the contact region of the mold with the imprint material by observing an entire shot region on the substrate,
wherein the detecting step sequentially detects a next alignment mark, among the plurality of alignment marks on the substrate, in a region where the spreading the contact region of the mold with the imprint material is completed and that is present closest to a position of a previously detected alignment mark, among the plurality of alignment marks on the substrate, upon changing the position of the detector.

2. The imprint method according to claim 1, further comprising the step of:
at least one of, based on a detecting result obtained in the detecting step, matching a shape of the pattern formed on the mold with a shape of a shot region on the substrate or aligning the mold with the substrate.

3. The imprint method according to claim 1, further comprising the step of:
calculating a correction amount of a shape of the pattern on the mold with respect to a shape of a shot region on the substrate by statistically processing a detection result obtained in the detecting step,
wherein the shape of the pattern on the mold is matched with the shape of the shot region based on the correction amount.

4. The imprint method according to claim 1, wherein a shape of the pattern on the mold is matched with a shape of a shot region on the substrate or the mold is aligned with the substrate in sequence each time one of the plurality of alignment marks on the substrate is detected.

5. An imprint method of forming a pattern of an imprint material by contacting the imprint material on a substrate with a mold having the pattern, the imprint method comprising the steps of:
contacting the mold with the imprint material on the substrate to spread a contact region of the mold with the imprint material, the contacting step including a first period coming after an initial contact of the mold with the imprint material but before completion of filling of the imprint material on the substrate and a second period coming after the first period, the contact region of the mold with the imprint material increasing from the first period to the second period; and
detecting, using a detector, a plurality of alignment marks on the substrate during the contacting step by:
in the first period, positioning the detector at a first position and detecting one alignment mark, among the plurality of alignment marks on the substrate, while the detector is at the first position and a mark provided on the mold corresponding to the one alignment mark has been filled with the imprint material; and
in the second period, after detecting the one alignment mark, moving the detector laterally relative to the mold to a second position different from the first position and detecting another alignment mark, among the plurality of alignment marks, provided at a position different from the one alignment mark, while the detector is at the second position and a mark provided on the mold corresponding to the another alignment mark has been filled with the imprint material.

6. The imprint method according to claim 5, further comprising the step of:
at least one of, based on a detecting result obtained in the detecting step, matching a shape of the pattern formed on the mold with a shape of a shot region on the substrate or aligning the mold with the substrate.

7. The imprint method according to claim 5, further comprising the step of:
calculating a correction amount of a shape of the pattern on the mold with respect to a shape of a shot region on the substrate by statistically processing a detection result obtained in the detecting step, wherein the shape of the pattern on the mold is matched with the shape of the shot region based on the correction amount.

8. The imprint method according to claim 5, wherein the detecting step sequentially detects the another alignment mark, which is a next alignment mark in a region where the spreading the contact region of the mold with the imprint material is completed and that is present closest to the position of the one alignment mark, which is a previously detected alignment mark, upon changing the position of the detector.

9. The imprint method according to claim 5, wherein the detecting step sequentially detects, during the second period, an alignment mark, among a plurality of alignment marks on the mold, in a region where the spreading of the contact region of the mold with the imprint material is completed in a completion order of the spreading the contact region of the mold with the imprint material among the plurality of alignment marks on the mold.

10. The imprint method according to claim 5, wherein a shape of the pattern on the mold is matched with a shape of a shot region on the substrate or the mold is aligned with the substrate in sequence each time one of the plurality of alignment marks on the substrate is detected.

11. The imprint method according to claim 8, further comprising the step of:
   determining a completion of the spreading the contact region of the mold with the imprint material by observing an entire shot region on the substrate.

12. The imprint method according to claim 11, further comprising the step of:
   determining a location to change the detector based on time from a start of contacting the pattern on the mold with the imprint material to the completion of the spreading of the contact region of the mold with the imprint material before the contacting step.

* * * * *